United States Patent
Takahashi et al.

(10) Patent No.: US 12,054,659 B2
(45) Date of Patent: Aug. 6, 2024

(54) HYDROGEN PEROXIDE DECOMPOSITION INHIBITOR

(71) Applicant: Kanto Kagaku Kabushiki Kaisha, Tokyo (JP)

(72) Inventors: Hideki Takahashi, Tokyo (JP); Erina Ogihara, Tokyo (JP); Pen-Nan Liao, Taoyuan (TW); Po-Heng Wu, Taoyuan (TW); Yi Li, Taoyuan (TW)

(73) Assignee: Kanto Kagaku Kabushiki Kaisha, Tokyo (JP)

( * ) Notice: Subject to any disclaimer, the term of this patent is extended or adjusted under 35 U.S.C. 154(b) by 238 days.

(21) Appl. No.: 17/617,207

(22) PCT Filed: Jun. 12, 2020

(86) PCT No.: PCT/JP2020/023200
§ 371 (c)(1),
(2) Date: Dec. 7, 2021

(87) PCT Pub. No.: WO2020/251016
PCT Pub. Date: Dec. 17, 2020

(65) Prior Publication Data
US 2022/0340814 A1     Oct. 27, 2022

(30) Foreign Application Priority Data
Jun. 12, 2019     (JP) ................ 2019-109266

(51) Int. Cl.
*C09K 13/06*     (2006.01)
*C09K 15/20*     (2006.01)
(Continued)

(52) U.S. Cl.
CPC .............. *C09K 13/06* (2013.01); *C09K 15/20* (2013.01); *C09K 15/30* (2013.01); *C09K 15/322* (2013.01); *H01L 21/31111* (2013.01)

(58) Field of Classification Search
None
See application file for complete search history.

(56) References Cited

U.S. PATENT DOCUMENTS 9,222,018 B1 * 12/2015 Casteel, Jr. ....... H01L 21/32134
2004/0226915 A1   11/2004 Ono et al.
(Continued)

FOREIGN PATENT DOCUMENTS

| CN | 107475715 | 12/2017 |
| JP | 2004 221261 | 8/2004 |

(Continued)

OTHER PUBLICATIONS

Office Action in corresponding Singapore Patent Application No. 11202113755S dated Jul. 5, 2023.
(Continued)

Primary Examiner — Allan W. Olsen
(74) Attorney, Agent, or Firm — McDonnell Boehnen Hulbert & Berghoff LLP

(57) ABSTRACT

The present invention addresses the problem of providing a decomposition inhibitor for inhibiting the decomposition of hydrogen peroxide included in an etching liquid composition for titanium nitride.

The present invention relates to a decomposition inhibitor that is used to inhibit the decomposition of hydrogen peroxide included in an etching liquid composition for titanium nitride and that includes at least one compound selected from among azole compounds, aminocarboxylic acid compounds, and phosphonic acid compounds as an active component.

4 Claims, 5 Drawing Sheets

TiN hard mask removal

(51) Int. Cl.
*C09K 15/30* (2006.01)
*C09K 15/32* (2006.01)
*H01L 21/311* (2006.01)

(56) References Cited

U.S. PATENT DOCUMENTS

| | | |
|---|---|---|
| 2009/0215658 A1 | 8/2009 | Minsek et al. |
| 2013/0280916 A1 | 10/2013 | Matsuda et al. |
| 2016/0177457 A1 | 6/2016 | Yokomizo et al. |
| 2017/0107460 A1 | 4/2017 | Liu et al. |
| 2018/0145035 A1* | 5/2018 | Singh ................ H01L 23/53295 |
| 2018/0148645 A1 | 5/2018 | Lee et al. |
| 2018/0237923 A1* | 8/2018 | Ishizaki ............ H01L 21/32134 |
| 2020/0010762 A1* | 1/2020 | Ishizaki .................... C23F 1/14 |
| 2020/0024750 A1 | 1/2020 | Sasaki et al. |

FOREIGN PATENT DOCUMENTS

| | | |
|---|---|---|
| JP | A2009054796 | 3/2009 |
| JP | A2009512194 | 3/2009 |
| KR | 20160067522 | 6/2016 |

OTHER PUBLICATIONS

Pre-appeal Examination Report in corresponding Japanese Patent Application No. 2019-109266 dated Jul. 4, 2023.
Extended European Search Report for EP Application 20821670.5 dated May 31, 2023.
Office Action for corresponding Japanese application No. JP 2019-109266 dated Feb. 16, 2024. (English Translation attached).
Office Action for corresponding Japanese application No. JP 2019-109266 dated Mar. 2, 2023. (English Translation attached).

* cited by examiner

[Fig.1]
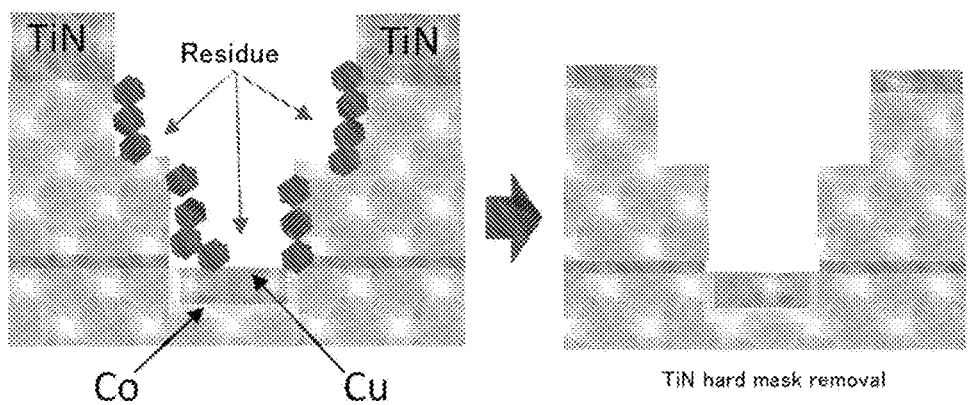
TiN hard mask removal
[Fig.2]
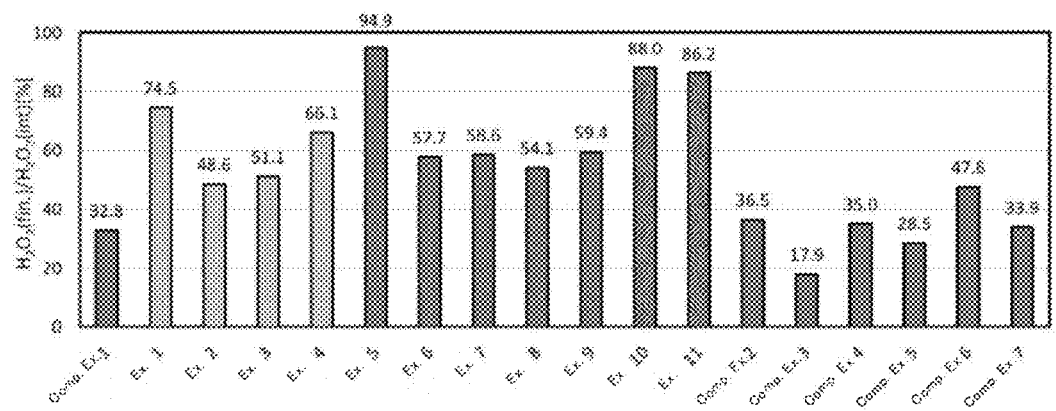

[Fig.3]
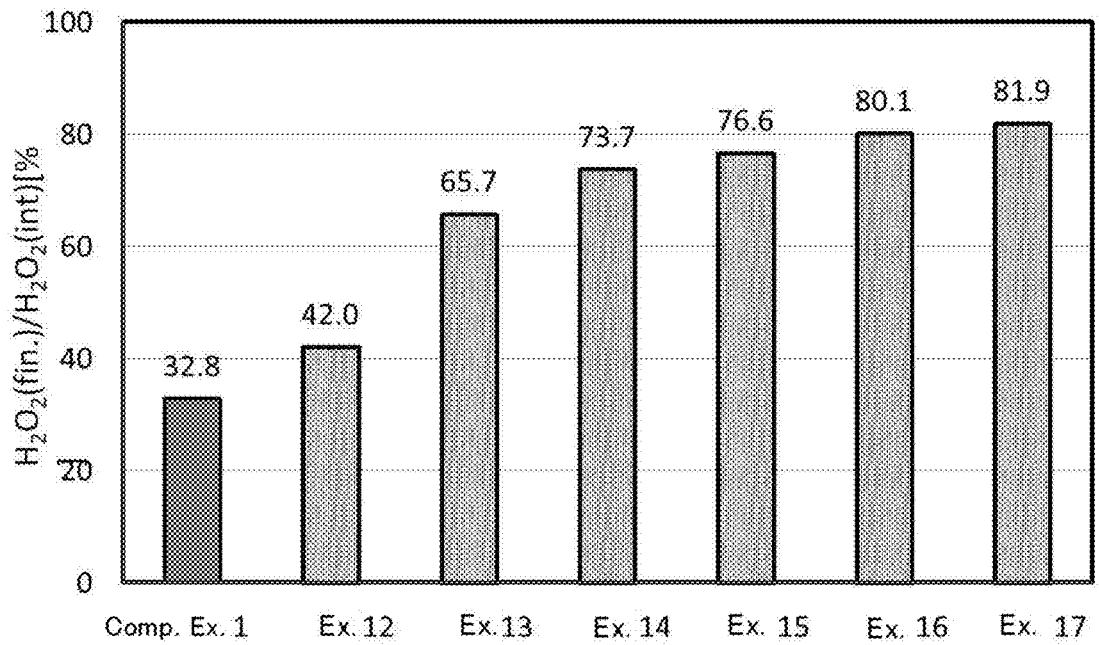
[Fig.4]
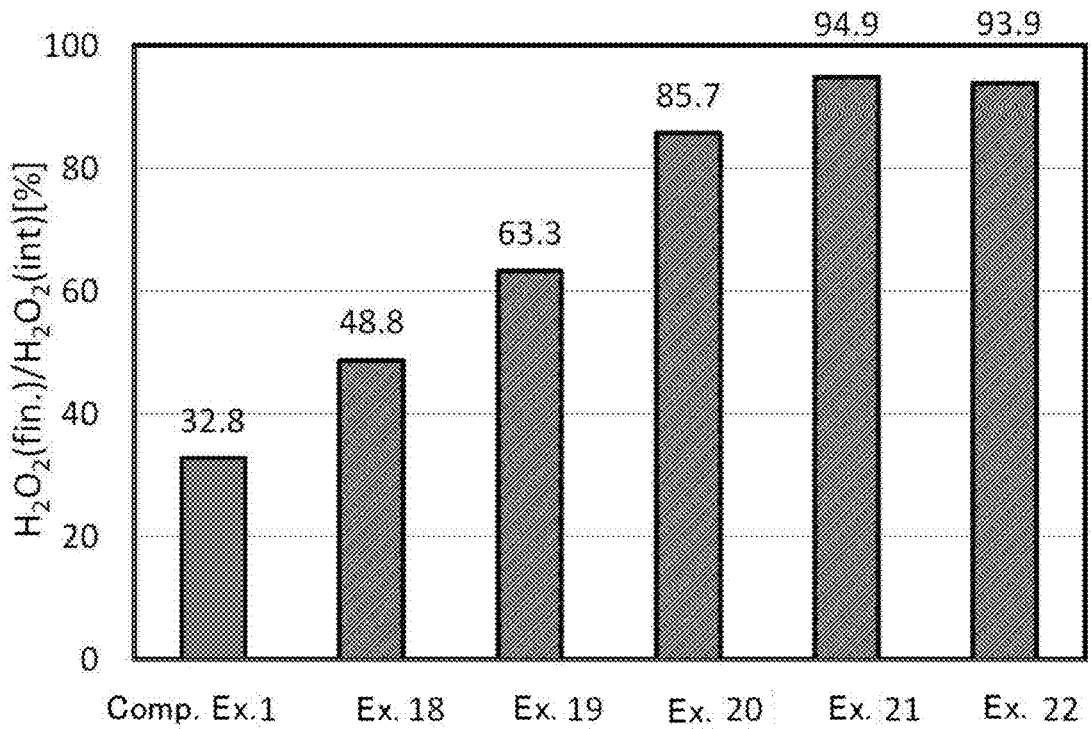

[Fig.5]
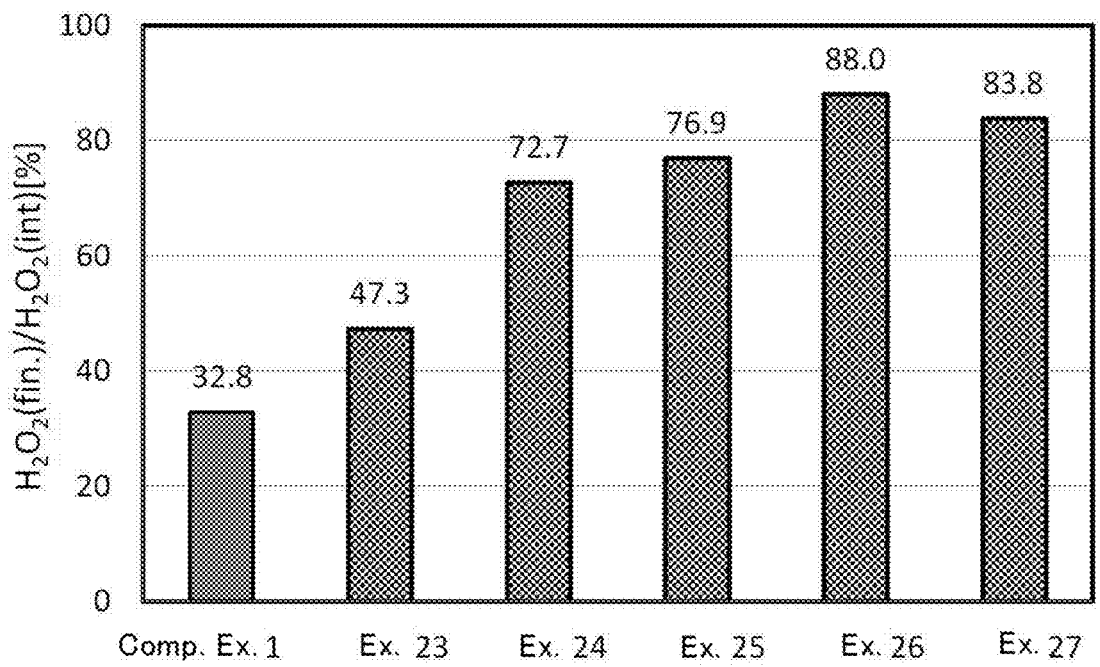
[Fig.6]
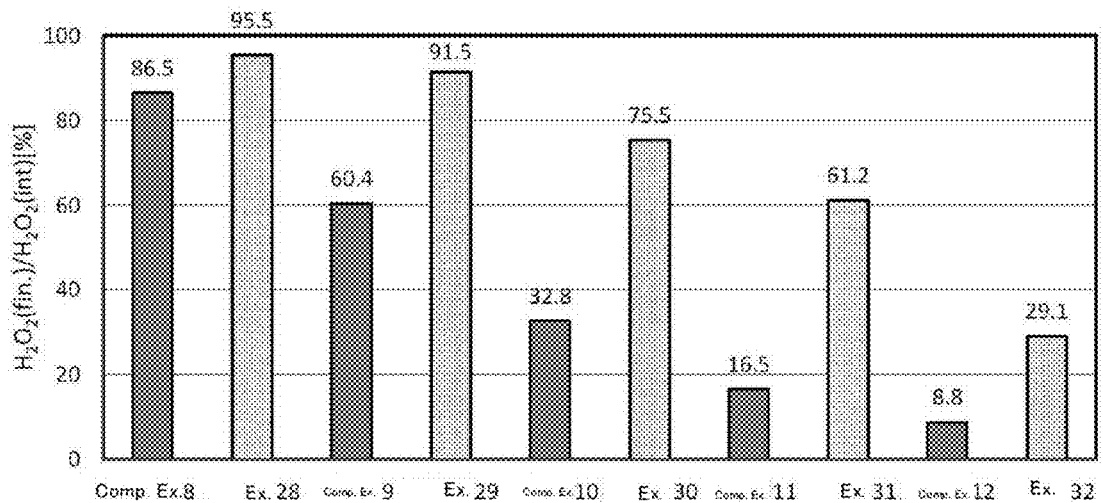

[Fig.7]
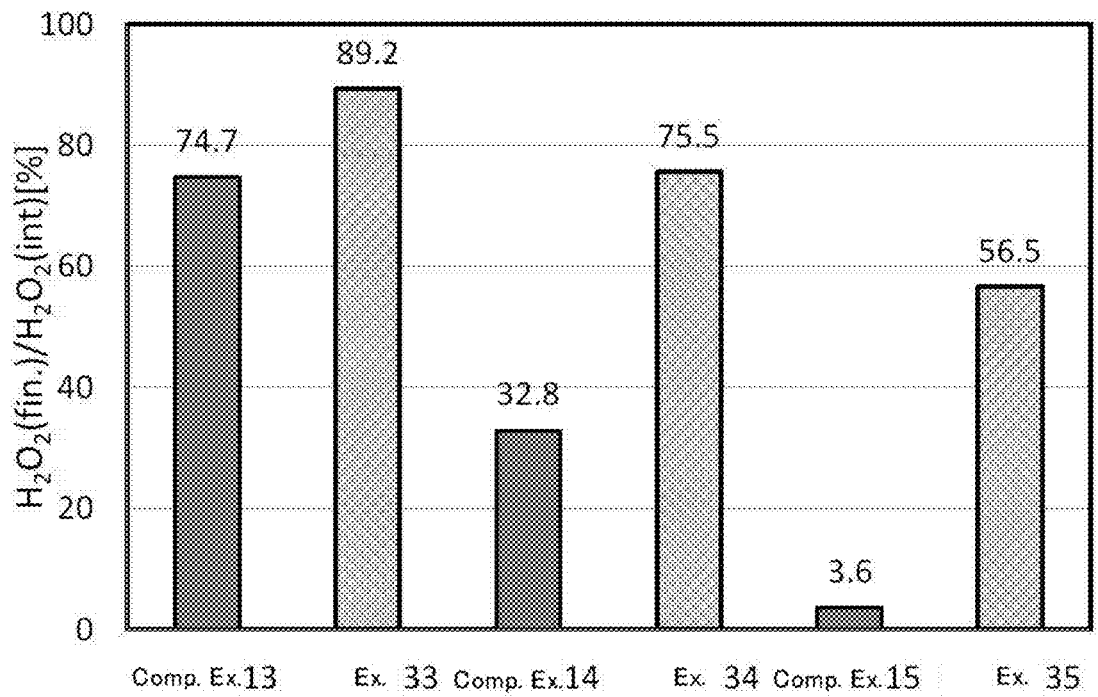
[Fig.8]
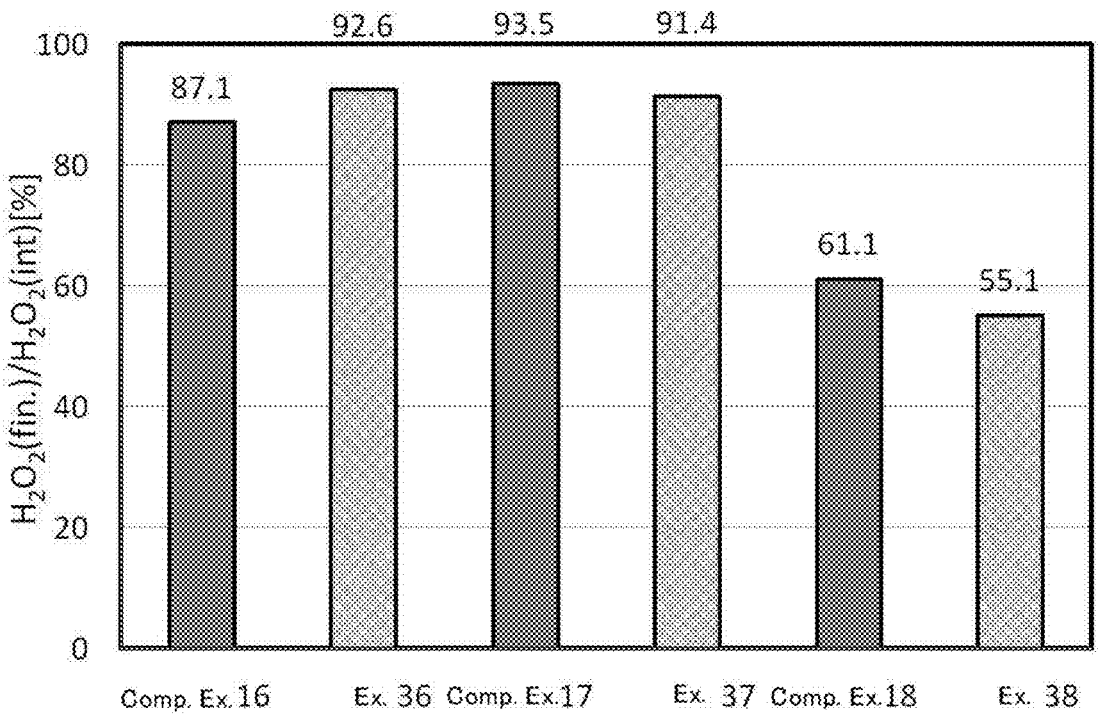

[Fig.9]
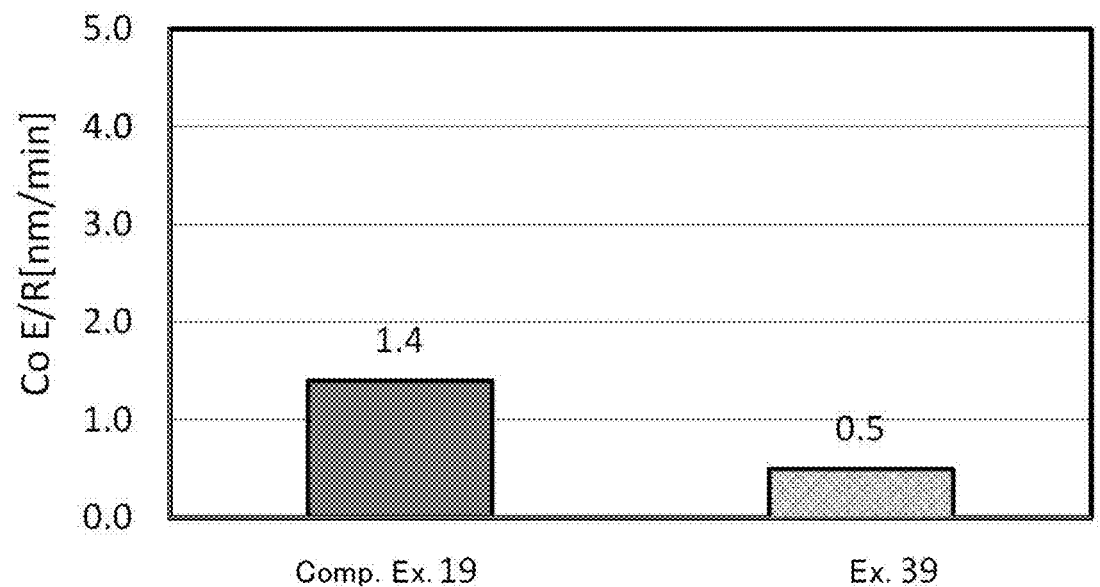
[Fig.10]
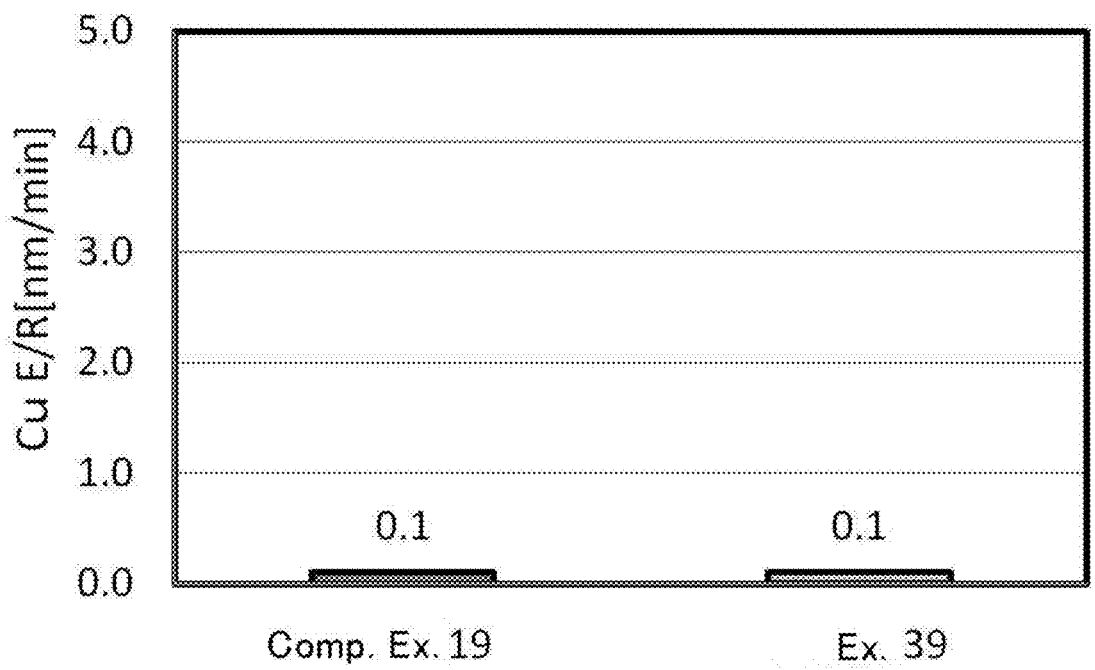

HYDROGEN PEROXIDE DECOMPOSITION INHIBITOR

This application is a U.S. National Phase application under 35 U.S.C. § 371 of PCT/JP2020/023200, filed Jun. 12, 2020, which claims priority from and the benefit of Japanese Application No.: 2019-109266, filed on Jun. 12, 2019, the specifications of which are hereby incorporated by reference in their entireties into the instant application.

TECHNICAL FIELD

The present invention relates to a decomposition inhibitor of hydrogen peroxide, used in an etching liquid composition comprising hydrogen peroxide.

BACKGROUND ART

Conventionally, an etching liquid composition comprising hydrogen peroxide has been known as an etching liquid composition used for etching semiconductor substrates. However, in an etching liquid composition comprising hydrogen peroxide, decomposition of hydrogen peroxide is promoted by dissolution of a metal, resulting in a problem such as shortened life of the etching liquid composition.

In order to prevent such decomposition of hydrogen peroxide, it has been studied to add a phosphonic acid-based chelating agent to the etching liquid composition (Patent Document 1). In this document, a titanium (Ti)-based metal film or a tungsten (W)-based metal film is targeted for etching.

In addition, an etching liquid composition comprising hydrogen peroxide for etching titanium nitride (TiN) as the object is known. For example, in order to selectively remove PVD titanium nitride from a semiconductor device comprising PVD titanium nitride and a second material such as Cu, a composition has been disclosed which comprises hydrogen peroxide, a base, a weak acid, an ammonium salt, triazole, long-chain organic amine or polyalkylamine and a solvent (Patent Document 2); however, no consideration is given to the prevention of the decomposition of hydrogen peroxide. In this document, triazole is added as a corrosion inhibitor to prevent copper loss.

CITATION LIST

Patent Documents

[Patent Document 1] JP No. 5343858
[Patent Document 2] JP A No. 2016-213461

SUMMARY OF INVENTION

Problems to be Solved by Invention

When an etching liquid composition comprising hydrogen peroxide is used, the present inventors have faced a problem that the degree of decomposition promotion of hydrogen peroxide varies greatly depending on the material to be etched; that is, specifically, when titanium nitride that is used as a hard mask in processing semiconductor elements is targeted for etching by using an etching liquid composition comprising hydrogen peroxide, then, hydrogen peroxide contained in the etching liquid composition is significantly decomposed as compared to the case where tungsten, silver or the like is targeted for etching. The present inventors have also speculated that this problem is caused by the following: i.e., the influence of a component such as metal ions derived from the etching target and dissolved in the etching liquid composition differs greatly depending on the kind of said component.

Therefore, the present inventors have proceeded with studies with the object of providing a decomposition inhibitor for inhibiting decomposition of hydrogen peroxide in the etching liquid composition in which titanium nitride is dissolved. That is, an object of the present invention is to provide a decomposition inhibitor for inhibiting decomposition of hydrogen peroxide contained in the etching liquid composition for titanium nitride.

Means for Solving Problems

In earnest research to solve the above problem, the present inventors have found that a decomposition inhibitor comprising at least one compound selected from azole compounds, aminocarboxylic acid compounds and phosphonic acid compounds as an active component inhibits the decomposition of hydrogen peroxide contained in an etching liquid composition for titanium nitride, and the present inventors have also found that when the decomposition inhibitor comprises an azole compound, in addition to inhibiting the decomposition of hydrogen peroxide, the decomposition inhibitor also prevents the corrosion of copper (Cu) and cobalt (Co) on a semiconductor element; as a result of further research, the present inventors have completed the present invention.

That is, the present invention relates to the following.

[1] A decomposition inhibitor used for inhibiting the decomposition of hydrogen peroxide contained in an etching liquid composition for titanium nitride, comprising at least one compound selected from azole compounds, aminocarboxylic acid compounds and phosphonic acid compounds as an active component.

[2] The decomposition inhibitor according to [1], further comprising water.

[3] The decomposition inhibitor according to [1] or [2], further comprising a water-soluble organic solvent.

[4] The decomposition inhibitor according to any one of [1] to [3], comprising at least two compounds selected from azole compounds, aminocarboxylic acid compounds and phosphonic acid compounds.

[5] The decomposition inhibitor according to any one of [1] to [4], comprising at least one compound selected from 1,2,4-triazole, 1,2,3-triazole, imidazole and benzimidazole as the azole compound.

[6] The decomposition inhibitor according to any one of [1] to [4], comprising at least one compound selected from trans-1,2-diaminecyclohexane-N,N,N',N'-tetraacetic acid, ethylenediaminetetraacetic acid, diethylenetriaminepentaacetic acid, glycoletherdiaminetetraacetic acid and triethylenetetraminehexacetic acid as the aminocarboxylic acid compound.

[7] The decomposition inhibitor according to any one of [1] to [4], comprising at least one compound selected from 1-hydroxyethane-1,1-diphosphonic acid and ethylenediaminetetramethylenephosphonic acid as the phosphonic acid compound.

[8] The decomposition inhibitor according to any one of [1] to [7], which is for adding at least one compound selected from azole compounds, aminocarboxylic acid compounds and phosphonic acid compounds to an etching liquid composition at a ratio of 2 mmol/L or more relative to 100 ppm of titanium nitride in the etching liquid composition.

[9] A method for inhibiting the decomposition of hydrogen peroxide contained in an etching liquid composition for titanium nitride, which uses the decomposition inhibitor according to any one of [1] to [8].

[10] An etching liquid composition for titanium nitride, comprising the decomposition inhibitor according to any one of [1] to [8] and hydrogen peroxide.

[11] The etching liquid composition for titanium nitride according to [10], comprising at least one compound selected from azole compounds, aminocarboxylic acid compounds and phosphonic acid compounds at a ratio of 2 mmol/L or more relative to 100 ppm of titanium nitride.

[12] The etching liquid composition for titanium nitride according to [10] or [11], further comprising a chelating agent (excluding azole compounds, aminocarboxylic acid compounds and phosphonic acid compounds).

[13] The etching liquid composition for titanium nitride according to any one of [10] to [12], which has a pH of 4.0 to 8.0.

Advantageous Effects of Invention

The decomposition inhibitor of the present invention can inhibit decomposition of hydrogen peroxide contained in an etching liquid composition for titanium nitride, and can prolong the life of the etching liquid composition.

When the decomposition inhibitor of the present invention comprises an azole compound, it not only inhibits the decomposition of hydrogen peroxide contained in an etching liquid composition for titanium nitride, but also prevents the corrosion of copper and cobalt on a semiconductor element, enabling good processing of the semiconductor element.

BRIEF DESCRIPTION OF DRAWINGS

FIG. 1 is a diagram showing removal of titanium nitride used as a hard mask.

FIG. 2 is a diagram showing the results of Evaluation 1.

FIG. 3 is a diagram showing the results of Evaluation 2, in which 1,2,4-triazole was used as a decomposition inhibitor.

FIG. 4 is a diagram showing the results of Evaluation 2, in which CyDTA was used as a decomposition inhibitor.

FIG. 5 is a diagram showing the results of Evaluation 2, in which HEDP was used as a decomposition inhibitor.

FIG. 6 is a diagram showing the results of Evaluation 3.

FIG. 7 is a diagram showing the results of Evaluation 4.

FIG. 8 is a diagram showing the results of Evaluation 5.

FIG. 9 is a diagram showing the results of etching rate of Co in Evaluation 6.

FIG. 10 is a diagram showing the results of etching rate of Cu in Evaluation 6.

EMBODIMENTS FOR CARRYING OUT INVENTION

Hereinafter, the present invention will be described in detail based on preferred embodiments of the present invention.

The present invention relates to a decomposition inhibitor comprising at least one compound selected from azole compounds, aminocarboxylic acid compounds and phosphonic acid compounds as an active component, which is used for inhibiting the decomposition of hydrogen peroxide contained in an etching liquid composition for titanium nitride.

The azole compound contained in the decomposition inhibitor of the present invention is not particularly limited, and examples thereof include 1,2,4-triazole, 1,2,3-triazole, imidazole, benzimidazole, benzotriazole (BTA), pyrazole, tetrazole, oxazole, thiazole, isothiazole, 5-amino-1H-tetrazole (ATZ), 3-amino-1,2,4-triazole (ATA), adenine, guanine, 5-phenyltetrazole and 5-mercapto-1-methyltetrazole, etc.; 1,2,4-triazole, 1,2,3-triazole, imidazole and benzimidazole are preferable, and 1,2,4-triazole and 1,2,3-triazole are more preferable.

The azole compound may be used alone or in combination. In addition, it may be used in combination with other active components, i.e., aminocarboxylic acid compounds and/or phosphonic acid compounds.

The aminocarboxylic acid compound contained in the decomposition inhibitor of the present invention is not particularly limited, and examples thereof include trans-1,2-diaminecyclohexane-N,N,N',N'-tetraacetic acid (CyDTA), ethylenediaminetetraacetic acid (EDTA), diethylenetriaminepentaacetic acid (DTPA), glycoletherdiaminetetraacetic acid (GEDTA), triethylenetetraminehexacetic acid (TTHA), hydroxyethyliminodiacetic acid (HIDA) and ethylenediamine-N,N'-disuccinic acid (EDDS), etc.; CyDTA, EDTA, DTPA, GEDTA and TTHA are preferable, and CyDTA is more preferable.

The aminocarboxylic acid compound may be used alone or in combination. In addition, it may be used in combination with other active components, i.e., azole compounds and/or phosphonic acid compounds.

The phosphonic acid compound contained in the decomposition inhibitor of the present invention is not limited as long as it has a phosphonic acid-derived structure, and examples thereof include 1-hydroxyethane-1,1-diphosphonic acid (HEDP), ethylenediamine tetramethylene phosphonic acid (EDTMP), nitrilotris(methylenephosphonic acid) (NTMP), 2-phosphonobutane-1,2,4-tricarboxylic acid (PBTC) and glycine-N,N-bis(methylenephosphonic acid) (glyphosine), etc.; HEDP and EDTMP are preferable.

The phosphonic acid compound may be used alone or in combination. In addition, it may be used in combination with other active components, i.e., azole compounds and/or aminocarboxylic acid compounds.

As one embodiment, the decomposition inhibitor of the present invention comprises at least two compounds selected from azole compounds, aminocarboxylic acid compounds and phosphonic acid compounds.

The decomposition inhibitor of the present invention is preferably added to an etching liquid composition such that the ratio of the at least one compound selected from azole compounds, aminocarboxylic acid compounds and phosphonic acid compounds becomes 2 mmol/L or more relative to 100 ppm of titanium nitride in the etching composition; and more preferably it is added at the ratio of 2 to 10 mmol/L relative to 100 ppm of titanium nitride, and furthermore preferably it is added at the ratio of 4 to 10 mmol/L.

The decomposition inhibitor of the present invention may further comprise water.

It is preferable that the decomposition inhibitor of the present invention further comprises a water-soluble organic solvent because it can remove organic residues, etc. generated during dry etching of titanium nitride.

The water-soluble organic solvent is not particularly limited, and examples thereof include alcohols having an ether group such as furfuryl alcohol, tetrahydrofurfuryl alcohol, etc.; glycol ethers such as methylene glycol, ethylene glycol, diethylene glycol, triethylene glycol, propylene glycol, dipropylene glycol, tripropylene glycol, etc.; esters such as carboxylate esters, carbonate esters, lactones, phosphate esters, sulfate esters, etc.; amides such as acetamide, N-methylacetamide, isobutyric acid amide, propionic acid amide, N-ethylacetamide, N,N-dimethylacetamide, etc.; and lactams such as N-methyl-2-pyrrolidone and 1,3-dimethyl-2-imidazolidinone, etc. Other examples include sulfur-containing compounds such as dimethyl sulfoxide and sulfolane.

The water-soluble organic solvent may be used alone or in combination.

The reason why the decomposition inhibitor of the present invention can inhibit the decomposition of hydrogen peroxide contained in an etching liquid composition for titanium nitride is not clear, however, it is considered as follows: at least one compound selected from azole compounds, aminocarboxylic acid compounds and phosphonic acid compounds forms a chelate with titanium dissolved in the etching liquid composition, which dissolves in water or a water-soluble organic solvent, thereby preventing the contact of titanium with hydrogen peroxide and inhibiting the decomposition of hydrogen peroxide.

The decomposition inhibitor of the present invention is used to inhibit the decomposition of hydrogen peroxide contained in an etching liquid composition for titanium nitride. As long as the etching liquid composition comprises titanium nitride, even when other metals such as tungsten, cobalt or copper in the device structure are further contained in the etching liquid composition, the decomposition inhibitor of the present invention inhibits the decomposition of hydrogen peroxide in the etching liquid composition.

The decomposition inhibitor of the present invention is, on the other hand, not suitable for inhibiting the decomposition of hydrogen peroxide in an etching liquid composition comprising only metals other than titanium nitride as a metal; for example, when the etching liquid composition comprises, as a metal, only tungsten, cobalt or copper in the device structure, the present decomposition inhibitor does not contribute to the inhibition of decomposition of hydrogen peroxide.

The present invention also relates to a method of inhibiting the decomposition of hydrogen peroxide contained in an etching liquid composition for titanium nitride, using the decomposition inhibitor of the present invention.

The present invention further relates to an etching liquid composition for titanium nitride, comprising the decomposition inhibitor of the present invention and hydrogen peroxide.

The etching liquid composition for titanium nitride of the present invention preferably comprises at least one compound selected from azole compounds, aminocarboxylic acid compounds and phosphonic acid compounds at a ratio of 2 mmol/L or more relative to 100 ppm of titanium nitride; it is more preferable to comprise at a ratio of 2 to 10 mmol/L relative to 100 ppm of titanium nitride, and furthermore preferable to comprise at a ratio of 4 to 10 mmol/L.

The etching liquid composition for titanium nitride of the present invention may further comprise a chelating agent (excluding azole compounds, aminocarboxylic acid compounds and phosphonic acid compounds).

The chelating agent is not particularly limited, and examples thereof include organic acids, for example, glycine, malic acid, citric acid, glycolic acid, tartaric acid, and lactic acid, etc.

The chelating agent may be used alone or in combination.

The etching liquid composition for titanium nitride of the present invention may further comprise a pH adjuster.

As the pH adjuster, ammonia, primary amine, secondary amine, tertiary amine, quaternary ammonium hydroxide, inorganic acid, and organic acid, etc. are used.

The pH adjuster may be used alone or in combination.

The etching liquid composition for titanium nitride of the present invention may further comprise a buffer for stabilizing pH.

Examples of the buffer include ammonium salts, such as ammonium acetate, ammonium oxalate, ammonium citrate, ammonium tartrate, ammonium sulfate, triammonium phosphate, diammonium hydrogen phosphate, ammonium dihydrogen phosphate, ammonium chloride, ammonium fluoride, etc. Diammonium hydrogen phosphate is preferred.

The buffer may be used alone or in combination.

The etching liquid composition for titanium nitride of the present invention may comprise any additional components other than a chelating agent, a pH adjuster, and a pH buffer, as long as they do not prevent the inhibition of the decomposition of hydrogen peroxide in the etching liquid composition; for example, copper anticorrosive agents, cobalt anticorrosive agents and the like can be mentioned. Examples of the copper and cobalt anticorrosive agents preferably include nitrogen-containing ring compounds such as 1,2,4-triazole, 1,2,3-triazole, imidazole, benzimidazole, BTA, pyrazole, tetrazole, oxazole, thiazole, isothiazole, ATZ, ATA, adenine, guanine, 5-phenyltetrazole, 5-mercapto-1-methyltetrazole, hexamethylenetetramine, 3,4-dihydro-3-hydroxy-4-oxo-1,2,4-triazine, 3H-1,2,3-triazolo[4, 5-b] pyridine-3-ol, 5-amino-1H-tetrazole, and 3-hydroxypyridine, etc., as well as anhydrous caffeine; and BTA is more preferable.

The pH of the etching liquid composition for titanium nitride of the present invention is not particularly limited; from the viewpoint of inhibiting the decomposition of hydrogen peroxide in the etching liquid composition, pH is preferably 4.0 to 8.0, and more preferably 6.0 to 7.5.

When etching titanium nitride using the etching liquid composition for titanium nitride of the present invention, the temperature of said composition is, from the viewpoint of ensuring a high etching rate of titanium nitride, preferably 40 to 80° C., and more preferably 50 to 60° C.

EXAMPLES

Next, the etching liquid composition of the present invention will be described in more detail with reference to examples and comparative examples described below; however, the present invention is not limited thereto.

<Evaluation 1: $H_2O_2$ Decomposition Inhibitory Ability>
(Measurement of $H_2O_2$ Concentration (Initial))

50 mL of an $H_2O_2$ aqueous solution of pH 6 having the composition shown in Table 1 was prepared. When preparing said aqueous solution, as a pH adjuster, phosphoric acid was used to decrease the pH value, and tetraethylammonium hydroxide was used to increase the pH value. Then, the $H_2O_2$ concentration (initial) of the aqueous solution was measured by redox titration using potassium permanganate.
(Decomposition of $H_2O_2$)

TiN powder was dissolved in the above $H_2O_2$ aqueous solution with stirring until the concentration reached 400 ppm, and the aqueous solution was left at 60° C. for 6 hours. Since water evaporates, water was added as appropriate to maintain the volume of $H_2O_2$ aqueous solution to be 50 mL.
(Measurement of $H_2O_2$ Concentration (Final))

For the above-mentioned $H_2O_2$ aqueous solution after being left to stand, the $H_2O_2$ concentration (final) was measured by redox titration using potassium permanganate.

Subsequently, $H_2O_2$ (final)/$H_2O_2$ (initial)×100 [%] was calculated. The results are shown in Table 1 and FIG. 2.

TABLE 1

| | $H_2O_2$ (initial) | Decomposition inhibitor | | $(NH_3)_2HPO_4$ | $H_2O_2$ (final)/ $H_2O_2$ (initial) |
|---|---|---|---|---|---|
| | [mol/L] | Compound | [mmol/L] | [mmol/L] | [%] |
| Comp. Ex. 1 | 4.9 | — | — | 37.9 | 32.8 |
| Ex. 1 | 4.9 | 1,2,4-Triazole | 20 | 37.9 | 74.5 |
| Ex. 2 | 5.0 | Imidazole | 20 | 37.9 | 48.6 |
| Ex. 3 | 4.9 | Benzimidazole | 20 | 37.9 | 51.1 |
| Ex. 4 | 4.9 | 1,2,3-Triazole | 20 | 37.9 | 66.1 |
| Ex. 5 | 4.8 | CyDTA | 20 | 37.9 | 94.9 |
| Ex. 6 | 4.4 | EDTA | 20 | 37.9 | 57.7 |
| Ex. 7 | 4.2 | DTPA | 20 | 37.9 | 58.6 |
| Ex. 8 | 4.2 | GEDTA | 20 | 37.9 | 54.1 |
| Ex. 9 | 4.0 | TTRA | 20 | 37.9 | 59.4 |
| Ex. 10 | 4.8 | HEDP | 20 | 37.9 | 88.0 |
| Ex. 11 | 4.8 | EDTMP | 20 | 37.9 | 86.2 |
| Comp. Ex. 2 | 4.9 | NMO | 20 | 37.9 | 36.5 |
| Comp. Ex. 3 | 4.9 | BDG | 20 | 37.9 | 17.9 |
| Comp. Ex. 4 | 4.9 | Glycine | 20 | 37.9 | 35.0 |
| Comp. Ex. 5 | 4.8 | Malic acid | 20 | 37.9 | 28.5 |
| Comp. Ex. 6 | 4.9 | Phenylurea | 20 | 37.9 | 47.6 |
| Comp. Ex. 7 | 5.0 | PVP | 20 | 37.9 | 33.9 |

*NMO: N-Methylmorpholine N-oxide
BDG: Butyl diglycol
PVP: Polyvinylpyrrolidone

Any of the etching liquid compositions comprising an azole compound, an aminocarboxylic acid compound, or a phosphonic acid compound as a decomposition inhibitor showed a good effect of inhibiting $H_2O_2$ decomposition, compared to the etching liquid composition comprising no decomposition inhibitor and the etching liquid compositions comprising a decomposition inhibitor other than the above.

<Evaluation 2: Concentration Dependence of $H_2O_2$ Decomposition Inhibitory Ability>

With respect to 1,2,4-triazole, CyDTA and HEDP, which are $H_2O_2$ decomposition inhibitors confirmed to have high $H_2O_2$ decomposition inhibitory ability in Evaluation 1, $H_2O_2$ decomposition inhibitory ability when the concentration of each decomposition inhibitor was changed was evaluated. Except that the $H_2O_2$ aqueous solutions having the composition shown in Tables 2 to 4 were used, measurement of $H_2O_2$ concentration (initial), decomposition of $H_2O_2$, and measurement of $H_2O_2$ concentration (final) were performed by the same method as in Evaluation 1, and $H_2O_2$ (final)/$H_2O_2$ (initial)×100 [%] was calculated. The results are shown in Tables 2 to 4 and FIGS. 3 to 5.

TABLE 2

| | $H_2O_2$ (initial) | Decomposition inhibitor | | $(NH_3)_2HPO_4$ | $H_2O_2$ (final)/ $H_2O_2$ (initial) |
|---|---|---|---|---|---|
| | [mol/L] | Compound | [mmol/L] | [mmol/L] | [%] |
| Comp. Ex. 1 | 4.9 | — | — | 37.9 | 32.8 |
| Ex. 12 | 4.9 | 1,2,4-Triazole | 2 | 37.9 | 42.0 |
| Ex. 13 | 4.8 | 1,2,4-Triazole | 10 | 37.9 | 65.7 |
| Ex. 14 | 4.9 | 1,2,4-Triazole | 15 | 37.9 | 73.7 |
| Ex. 15 | 4.8 | 1,2,4-Triazole | 20 | 37.9 | 76.6 |
| Ex. 16 | 4.9 | 1,2,4-Triazole | 40 | 37.9 | 80.1 |
| Ex. 17 | 4.8 | 1,2,4-Triazole | 100 | 37.9 | 81.9 |

TABLE 3

| | $H_2O_2$ (initial) | Decomposition inhibitor | | $(NH_3)_2HPO_4$ | $H_2O_2$ (final)/ $H_2O_2$ (initial) |
|---|---|---|---|---|---|
| | [mol/L] | Compound | [mmol/L] | [mmol/L] | [%] |
| Comp. Ex. 1 | 4.9 | — | — | 37.9 | 32.8 |
| Ex. 18 | 4.9 | CyDTA | 2 | 37.9 | 48.8 |
| Ex. 19 | 4.9 | CyDTA | 10 | 37.9 | 63.3 |
| Ex. 20 | 4.9 | CyDTA | 15 | 37.9 | 85.7 |
| Ex. 21 | 4.8 | CyDTA | 20 | 37.9 | 94.9 |
| Ex. 22 | 4.9 | CyDTA | 40 | 37.9 | 93.9 |

TABLE 4

| | $H_2O_2$ (initial) | Decomposition inhibitor | | $(NH_3)_2HPO_4$ | $H_2O_2$ (final)/ $H_2O_2$ (initial) |
|---|---|---|---|---|---|
| | [mol/L] | Compound | [mmol/L] | [mmol/L] | [%] |
| Comp. Ex. 1 | 4.9 | — | — | 37.9 | 32.8 |
| Ex. 23 | 4.9 | HEDP | 2 | 37.9 | 47.3 |
| Ex. 24 | 4.8 | HEDP | 10 | 37.9 | 72.7 |
| Ex. 25 | 4.8 | HEDP | 15 | 37.9 | 76.9 |
| Ex. 26 | 4.8 | HEDP | 20 | 37.9 | 88.0 |
| Ex. 27 | 4.6 | HEDP | 40 | 37.9 | 83.8 |

Any of the etching liquid compositions using an azole compound, an aminocarboxylic acid compound, or a phosphonic acid compound as a decomposition inhibitor showed higher $H_2O_2$ decomposition inhibitory effect regardless of the concentration of the decomposition inhibitor, compared to the case wherein the decomposition inhibitor is not contained.

<Evaluation 3: pH Dependence of $H_2O_2$ Decomposition Inhibitory Ability>

In the $H_2O_2$ aqueous solution comprising 1,2,4-triazole as an $H_2O_2$ decomposition inhibitor, $H_2O_2$ decomposition inhibitory ability when the pH was changed was evaluated. As the pH adjuster, phosphoric acid was used to decrease the pH value, and tetraethylammonium hydroxide was used to increase the pH value. Except that the $H_2O_2$ aqueous solutions having the pH value shown in Table 5 were used, measurement of $H_2O_2$ concentration (initial), decomposition of $H_2O_2$, and measurement of $H_2O_2$ concentration (final) were performed by the same method as in Evaluation 1, and $H_2O_2$ (final)/$H_2O_2$ (initial)×100 [%] was calculated. The results are shown in Tables 5 and FIG. 6.

TABLE 5

| | $H_2O_2$ (initial) [mol/L] | Decomposition inhibitor Compound | [mmol/L] | $(NH_3)_2HPO_4$ [mmol/L] | pH | $H_2O_2$ (final)/ $H_2O_2$ (initial) [%] |
|---|---|---|---|---|---|---|
| Comp. Ex. 8 | 4.9 | — | — | 37.9 | 4 | 86.5 |
| Ex. 28 | 4.9 | 1,2,4-Triazole | 20 | 37.9 | 4 | 95.5 |
| Comp. Ex. 9 | 4.9 | — | — | 37.9 | 5 | 60.4 |
| Ex. 29 | 4.9 | 1,2,4-Triazole | 20 | 37.9 | 5 | 91.5 |
| Comp. Ex. 10 | 4.9 | — | — | 37.9 | 6 | 32.8 |
| Ex. 30 | 4.9 | 1,2,4-Triazole | 20 | 37.9 | 6 | 75.5 |
| Comp. Ex. 11 | 4.9 | — | — | 37.9 | 7 | 16.5 |
| Ex. 31 | 4.9 | 1,2,4-Triazole | 20 | 37.9 | 7 | 61.2 |
| Comp. Ex. 12 | 4.8 | — | — | 37.9 | 8 | 8.8 |
| Ex. 32 | 4.8 | 1,2,4-Triazole | 20 | 37.9 | 8 | 29.1 |

The etching liquid compositions comprising 1,2,4-triazole as a decomposition inhibitor showed higher $H_2O_2$ decomposition inhibitory effect at any pH value, compared to the etching liquid compositions comprising no decomposition inhibitor.

<Evaluation 4: Temperature Dependence of $H_2O_2$ Decomposition Inhibitory Ability>

In the $H_2O_2$ aqueous solution comprising 1,2,4-triazole as an $H_2O_2$ decomposition inhibitor, $H_2O_2$ decomposition inhibitory ability when the temperature was changed was evaluated. Except that the $H_2O_2$ aqueous solutions having the temperature shown in Table 7 were used, measurement of $H_2O_2$ concentration (initial), decomposition of $H_2O_2$, and measurement of $H_2O_2$ concentration (final) were performed by the same method as in Evaluation 1, and $H_2O_2$ (final)/ $H_2O_2$ (initial)×100 [%] was calculated. The results are shown in Tables 6 and FIG. 7.

TABLE 6

| | $H_2O_2$ (initial) [mol/L] | Decomposition inhibitor Compound | [mmol/L] | $(NH_3)_2HPO_4$ [mmol/L] | Temp [° C.] | $H_2O_2$ (final)/ $H_2O_2$ (initial) [%] |
|---|---|---|---|---|---|---|
| Comp. Ex. 13 | 4.9 | — | — | 37.9 | 40 | 74.7 |
| Ex. 33 | 4.9 | 1,2,4-Triazole | 20 | 37.9 | 40 | 89.2 |
| Comp. Ex. 14 | 4.9 | — | — | 37.9 | 60 | 32.8 |
| Ex. 34 | 4.9 | 1,2,4-Triazole | 20 | 37.9 | 60 | 75.5 |
| Comp. Ex. 15 | 5.0 | — | — | 37.9 | 80 | 3.6 |
| Ex. 35 | 5.0 | 1,2,4-Triazole | 20 | 37.9 | 80 | 56.5 |

The etching liquid compositions comprising 1,2,4-triazole as a decomposition inhibitor showed higher $H_2O_2$ decomposition inhibitory effect at any temperature, compared to the etching liquid compositions comprising no decomposition inhibitor.

<Evaluation 5: $H_2O_2$ Decomposition Inhibitory Ability in $H_2O_2$ Aqueous Solution Comprising a Metal Other than TiN>

In the $H_2O_2$ aqueous solution comprising 1,2,4-triazole as an $H_2O_2$ decomposition inhibitor, $H_2O_2$ decomposition inhibitory ability when W, Ag or Cu was added instead of TiN was evaluated. Except that the metals shown in Table 7 were added and 5 wt % of malonic acid was added to promote the dissolution of Cu during Cu dissolution, measurement of $H_2O_2$ concentration (initial), decomposition of $H_2O_2$, and measurement of $H_2O_2$ concentration (final) were performed by the same method as in Evaluation 1, and $H_2O_2$ (final)/$H_2O_2$ (initial)×100 [%] was calculated. The results are shown in Tables 7 and FIG. 8.

TABLE 7

| | $H_2O_2$ (initial) [mol/L] | Decomposition inhibitor Compound | [mmol/L] | $(NH_3)_2HPO_4$ [mmol/L] | Metals added Metal | [ppm] | $H_2O_2$ (final)/ $H_2O_2$ (initial) [%] |
|---|---|---|---|---|---|---|---|
| Comp. Ex. 16 | 4.9 | — | — | 400 | W | 400 | 87.1 |
| Ex. 36 | 4.9 | 1,2,4-Triazole | 20 | 400 | W | 400 | 92.6 |

TABLE 7-continued

|  | $H_2O_2$ (initial) [mol/L] | Decomposition inhibitor Compound | [mmol/L] | $(NH_3)_2HPO_4$ [mmol/L] | Metals added Metal | [ppm] | $H_2O_2$ (final)/ $H_2O_2$ (initial) [%] |
|---|---|---|---|---|---|---|---|
| Comp. Ex. 17 | 4.9 | — | — | 100 | Ag | 100 | 93.5 |
| Ex. 37 | 4.9 | 1,2,4-Triazole | 20 | 100 | Ag | 100 | 91.4 |
| Comp. Ex. 18 | 3.8 | — | — | 400 | Cu | 400 | 61.1 |
| Ex. 38 | 3.8 | 1,2,4-Triazole | 20 | 400 | Cu | 400 | 55.1 |

The etching liquid compositions comprising 1,2,4-triazole as a decomposition inhibitor showed $H_2O_2$ decomposition inhibitory effect when TiN was dissolved in the composition, whereas no $H_2O_2$ decomposition inhibitory effect was shown when only W, Ag or Cu was dissolved as a metal in the etching liquid compositions.

<Evaluation 6: Anticorrosion Property of Co and Cu>
(Wafer Production)

A Co film having a thickness of 40 nm was formed by a CVD method on a Si substrate having a diameter of 300 mm, to obtain a Co wafer.

A Cu film having a thickness of 2000 nm was formed by a plating method on a Si substrate having a diameter of 200 mm, to obtain a Cu wafer.

(Pretreatment of Wafer)

Since natural oxides are present on the surface of Co and Cu, pretreatment was performed to remove them.

The Cu substrate was cut into 1.5×1.5 cm², allowed to stand in an aqueous solution of oxalic acid (1 wt %) at 25° C. for 1 minute, and rinsed with ultrapure water (DIW) for 1 minute to obtain a Cu wafer (after pretreatment).

The Co substrate was cut into 1.5×1.5 cm², allowed to stand in an aqueous solution of oxalic acid (1 wt %) at 25° C. for 10 seconds, and rinsed with ultrapure water (DIW) for 10 seconds to obtain a Co wafer (after pretreatment).

(Evaluation of Damage to Co and Cu)

The above Co wafer (after pretreatment) and the Cu wafer (after pretreatment) were immersed in 50 mL of etching liquid compositions having the composition shown in Table 8, and the wafers were respectively allowed to stand at 60° C. for 1 minute. Then, the wafers were taken out to obtain the etching liquid compositions (after immersion of Co and Cu).

(Measurement of Etching Rate of Etching Liquid Composition)

A 1 mL solution was taken out from the above etching liquid compositions (after immersion of Co and Cu), and diluted in a measuring flask to 50 mL. The concentrations of Co and Cu in the etching liquid composition that has been diluted in the measuring flask were measured by ICP-MS (manufactured by Agilent, model number: 7500cs), and the etching rates (E.R.) of Co and Cu of the etching liquid composition were calculated from the surface area of Co of the wafer and the Co and Cu concentrations in the etching liquid composition. The results are shown in Table 8, FIGS. 9 and 10.

TABLE 8

|  | $H_2O_2$ (initial) [mol/L] | Decomposition inhibitor Compound | [mmol/L] | $(NH_3)_2HPO_4$ [mmol/L] | E/R [nm/min] Co | Cu |
|---|---|---|---|---|---|---|
| Comp. Ex. 19 | 4.9 | — | — | 37.9 | 1.4 | 0.1 |
| Ex. 39 | 4.9 | 1,2,4-Triazole | 20 | 37.9 | 0.5 | 0.1 |

The etching liquid composition comprising 1,2,4-triazole as a decomposition inhibitor showed anticorrosion effects for Cu and Co, in addition to inhibiting the decomposition of $H_2O_2$ contained in the etching liquid composition for titanium nitride.

The invention claimed is:

1. A method for inhibiting the decomposition of hydrogen peroxide contained in an etching liquid composition for titanium nitride, which comprises adding a decomposition inhibitor to the etching liquid composition for titanium nitride which contains hydrogen peroxide, wherein the decomposition inhibitor comprises azole compounds as an active component, and wherein the decomposition inhibitor is added to the etching liquid composition so that azole compounds are comprised at a ratio from 2 mmol/L to 10 mmol/L relative to 100 ppm of titanium nitride in the etching liquid composition.

2. The method of claim 1, wherein the decomposition inhibitor further comprises water.

3. The method of claim 1, wherein the decomposition inhibitor further comprises a water-soluble organic solvent.

4. The method of claim 1, wherein the decomposition inhibitor comprises at least one compound selected from 1,2,4-triazole, 1,2,3-triazole, imidazole, and benzimidazole as the azole compound.

* * * * *